(12) United States Patent
Tseng et al.

(10) Patent No.: US 10,897,823 B2
(45) Date of Patent: Jan. 19, 2021

(54) CIRCUIT BOARD, PACKAGE STRUCTURE AND METHOD OF MANUFACTURING THE SAME

(71) Applicant: Unimicron Technology Corp., Taoyuan (TW)

(72) Inventors: Tzyy-Jang Tseng, Taoyuan (TW); Cheng-Ta Ko, Taipei (TW); Kai-Ming Yang, Taoyuan (TW); Chih-Lun Wang, Hsinchu County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 16/361,180

(22) Filed: Mar. 21, 2019

(65) Prior Publication Data

US 2019/0306987 A1   Oct. 3, 2019

(30) Foreign Application Priority Data

Apr. 2, 2018   (TW) .............................. 107111606 A

(51) Int. Cl.
| | |
|---|---|
| *H05K 1/18* | (2006.01) |
| *H05K 1/09* | (2006.01) |
| *H05K 1/11* | (2006.01) |
| *H05K 1/02* | (2006.01) |
| *H05K 3/42* | (2006.01) |
| *H05K 3/00* | (2006.01) |
| *H05K 3/46* | (2006.01) |

(52) U.S. Cl.
CPC .......... *H05K 1/185* (2013.01); *H05K 1/0271* (2013.01); *H05K 1/09* (2013.01); *H05K 1/115* (2013.01); *H05K 3/007* (2013.01); *H05K 3/429* (2013.01); *H05K 3/4644* (2013.01)

(58) Field of Classification Search
USPC ......................................................... 361/761
See application file for complete search history.

(56) References Cited

U.S. PATENT DOCUMENTS

2013/0025120 A1* 1/2013 Hondo ................. H05K 3/0014
                                                                29/849
2017/0309584 A1   10/2017 Xie et al.

FOREIGN PATENT DOCUMENTS

| CN | 1366444 | 8/2002 |
|---|---|---|
| CN | 1466777 | 1/2004 |
| CN | 101754578 | 6/2010 |

(Continued)

OTHER PUBLICATIONS

"Office Action of China Counterpart Application", dated Jul. 30, 2020, p. 1-p. 10.

*Primary Examiner* — Andargie M Aychillhum
(74) *Attorney, Agent, or Firm* — JCIPRNET

(57) ABSTRACT

A circuit board including an interconnect substrate and a multilayer structure is provided. The interconnect substrate includes a core layer and a conductive structure disposed on the core layer. The multilayer structure is disposed on the conductive structure. The multilayer structure includes a plurality of dielectric layers and a plurality of circuit structures. The circuit structures are disposed in the dielectric layers. A topmost layer in the circuit structures is exposed to the dielectric layers to be in contact with the conductive structure. A pattern of the topmost layer in the circuit structures and a pattern of a top surface of the conductive structure are engaged with each other.

8 Claims, 12 Drawing Sheets

(56) References Cited

FOREIGN PATENT DOCUMENTS

| | | | |
|---|---|---|---|
| CN | 103026805 | | 4/2013 |
| JP | H0433396 | | 2/1992 |
| JP | H10247783 | * | 9/1998 |
| TW | I431749 | | 3/2014 |
| TW | 201536143 | | 9/2015 |

* cited by examiner

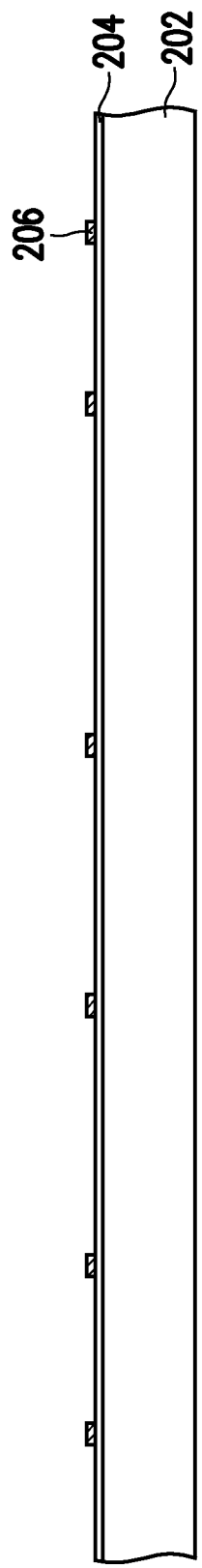

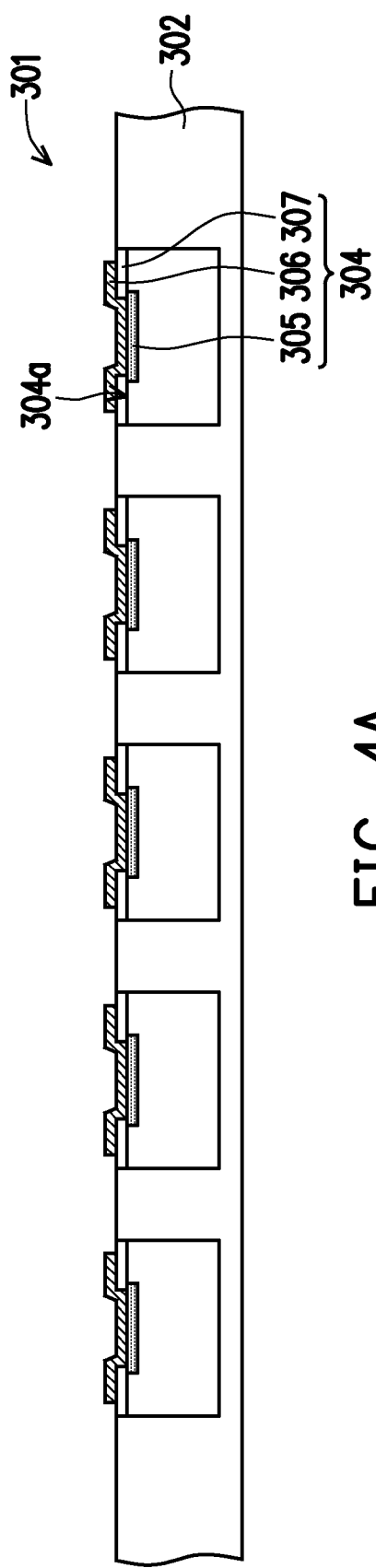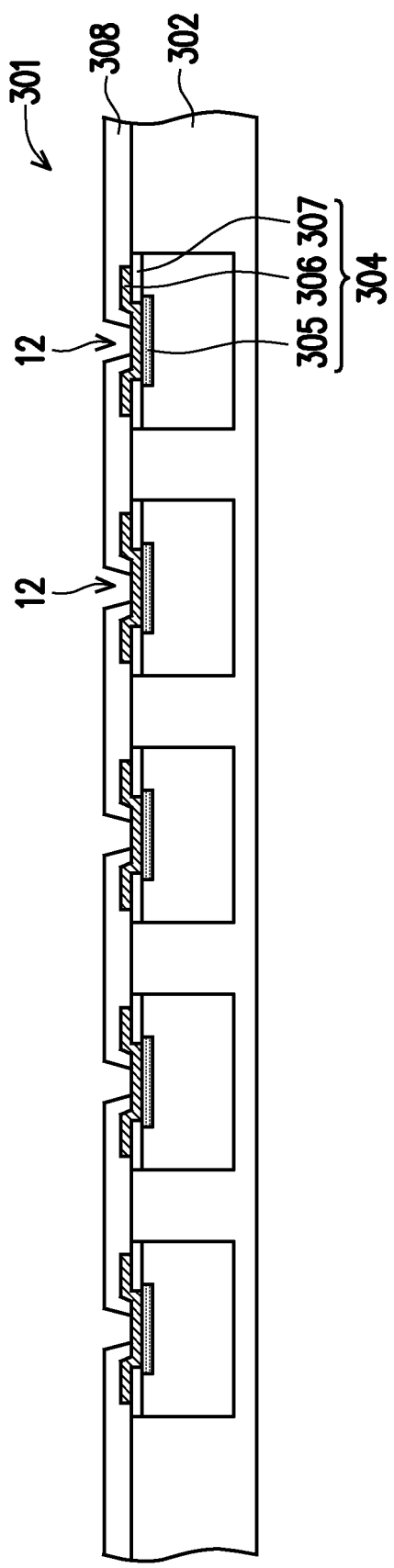

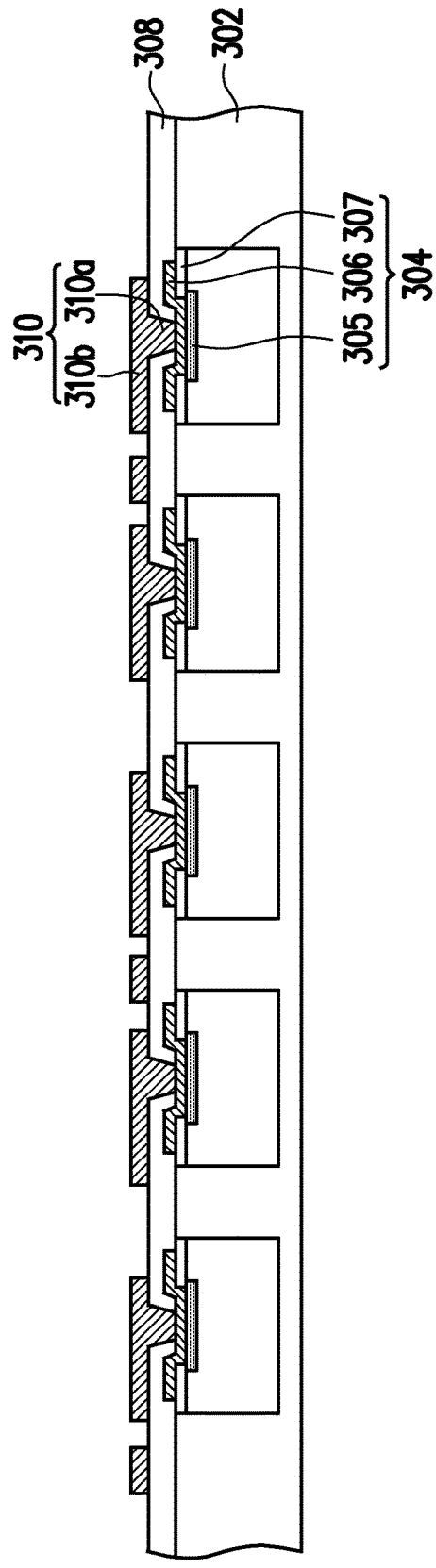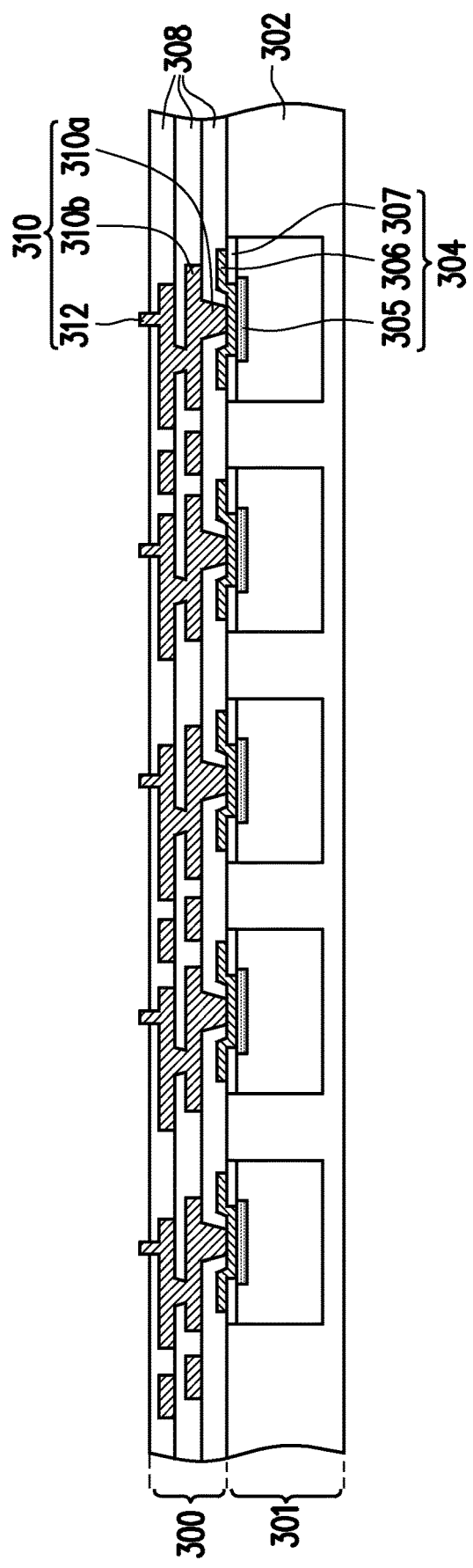

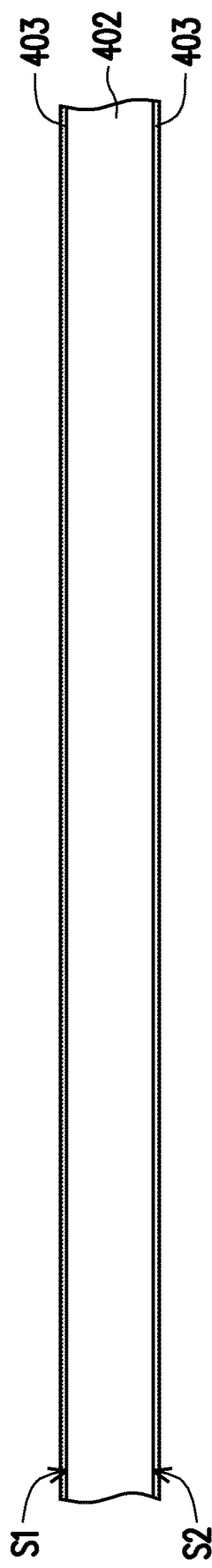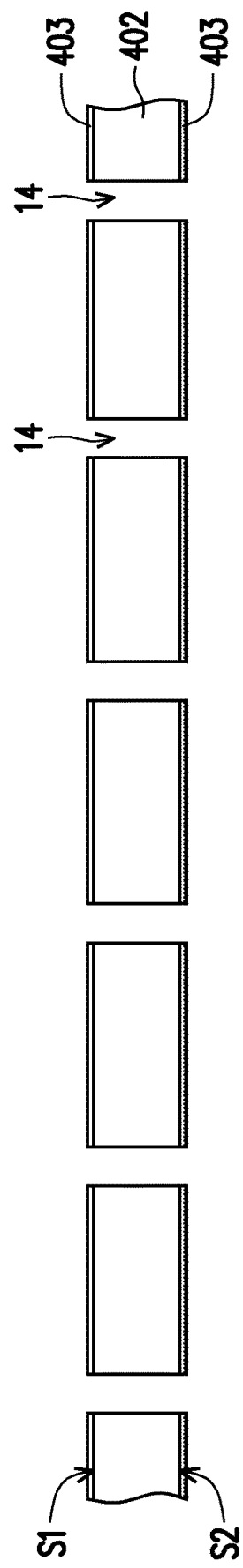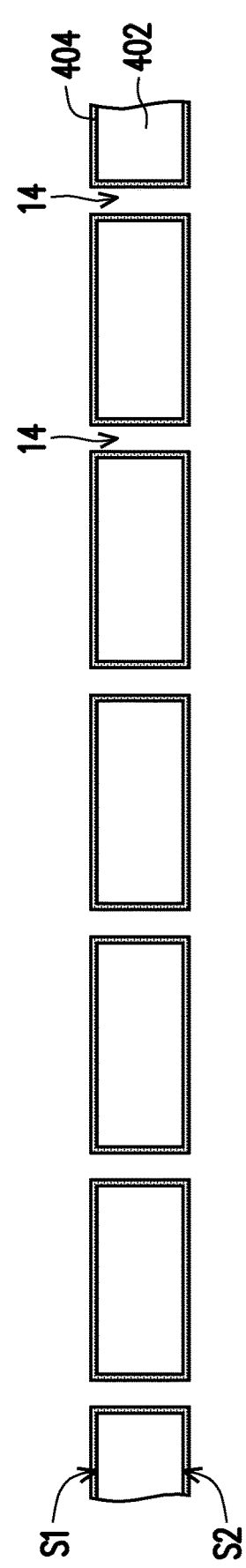

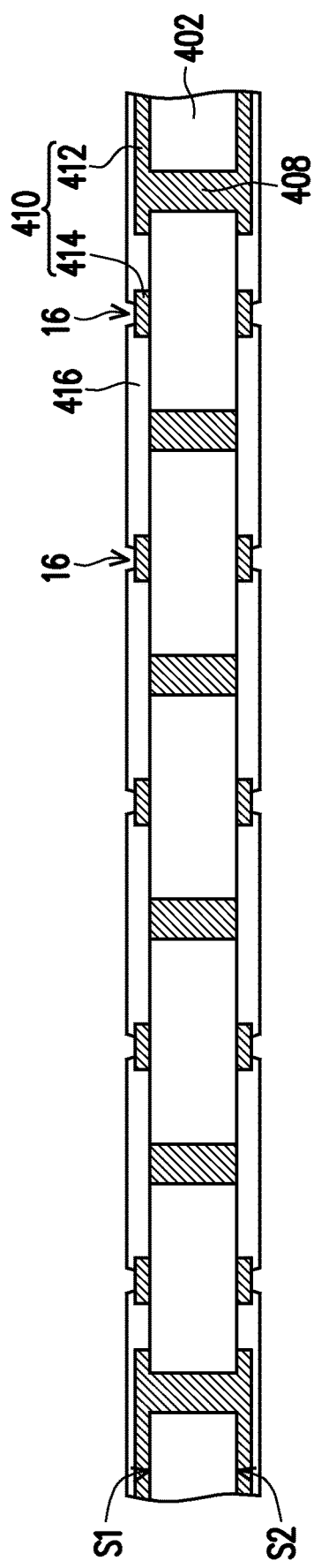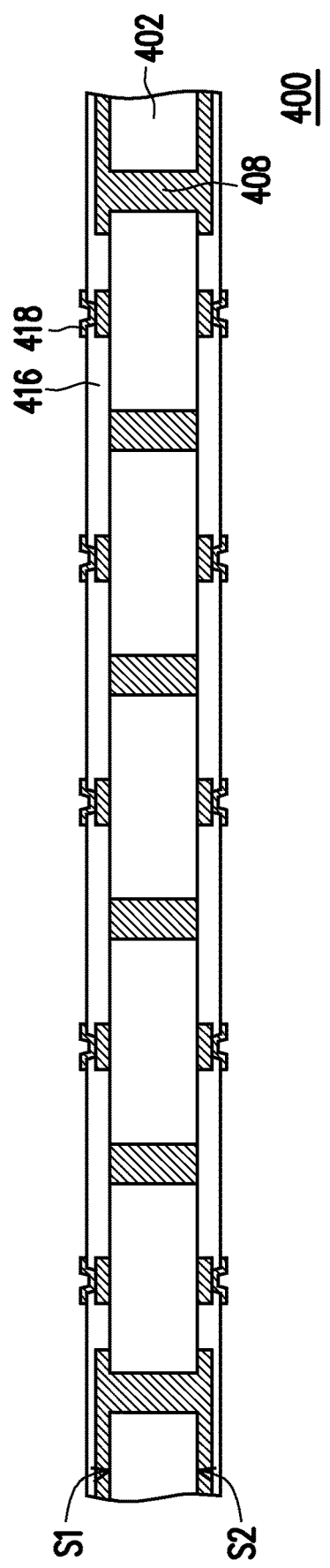

CIRCUIT BOARD, PACKAGE STRUCTURE AND METHOD OF MANUFACTURING THE SAME

CROSS REFERENCE TO RELATED APPLICATION

This application claims the priority benefit of Taiwan application serial no. 107111606, filed on Apr. 2, 2018. The entirety of the above-mentioned patent application is hereby incorporated by reference herein and made a part of specification.

BACKGROUND

Technical Field

The invention relates to a circuit board, a package structure, and a method of manufacturing the same.

Description of Related Art

Generally, the multilayer circuit structures of the circuit boards are manufactured by a build-up manner or a lamination manner most of the time, so the multilayer circuit structures may feature high circuit density and reduced circuit pitches. For instance, when a multilayer circuit structure is manufactured, a copper foil and prepreg (pp) are used to constitute a build-up structure first and the build-up structure is repeatedly laminated to be stacked on the core layer, so that the multilayer circuit structure is formed, thereby increasing the internal layout space of the multilayer circuit structure. Conductive circuits may be formed by the conductive material on the build-up structure according to the required circuit layout, while the blind holes or vias in the build-up structure may be additionally filled with the conductive material to communicate each layer of the conductive circuits. In this way, the number of circuit structures in the multilayer circuit structure may be adjusted according to needs, and the multilayer circuit structure may be formed through the foregoing method.

With technology advancement, development of various types of electronic products have been following the trend of high speed, high efficiency, light weight, and compact size. Under this trend, the numbers of layers of the multilayer circuit structures increase as well so as to satisfy the demand for complex electronic product design. Nevertheless, when layers in a multilayer circuit structure increase, the warpage issue of the multilayer circuit structure becomes severe. Further, when the multilayer circuit structure is applied to a package structure, the warpage issue may occur in the package structure as well, and the yield rate of the package structure is thereby affected.

SUMMARY

The invention provides a circuit board, a package structure, and a method of manufacturing the same capable of improving the warpage issue of the circuit board and further increasing a yield rate of the package structure.

The invention provides a circuit board including an interconnect substrate and a multilayer structure. The interconnect substrate includes a core layer and a conductive structure disposed on the core layer. The multilayer structure is disposed on the conductive structure. The multilayer structure includes a plurality of dielectric layers and a plurality of circuit structures. The circuit structures are disposed in the dielectric layers. A topmost layer in the circuit structures is exposed to the dielectric layers to contact with the conductive structure. A pattern of the topmost layer in the circuit structures and a pattern of a top surface of the conductive structure are engaged with each other.

The invention provides a package structure including the circuit board and an embedded chip molding (ECM) substrate. The embedded chip molding substrate is disposed on the multilayer structure of the circuit board so that the multilayer structure is disposed between the interconnect substrate and the embedded chip molding substrate.

The invention provides a method of manufacturing a circuit board, and the method includes the following steps. An interconnect substrate is provided. The interconnect substrate includes a core layer and a conductive structure disposed on the core layer. A bonding step is performed to bond the multilayer structure and the conductive structure of the interconnect substrate together. The multilayer structure includes a plurality of dielectric layers and a plurality of circuit structures. The circuit structures are disposed in the dielectric layers. A topmost layer in the circuit structures is exposed to the dielectric layers to contact with the conductive structure. A pattern of the topmost layer in the circuit structures and the pattern of the top surface of the conductive structure are engaged with each other.

The invention further provides a method of manufacturing a package structure, and the method includes the following steps. An embedded chip molding substrate is provided. The circuit board is formed on the embedded chip molding substrate, so that the multilayer structure of the circuit board is disposed between the interconnect substrate of the circuit board and the embedded chip molding substrate.

To sum up, in the embodiments of the invention, the multilayer structures are formed on the two surfaces of the interconnect substrate, so as to decrease the number of layers of the multilayer structures, thereby improving the warpage issue and increasing the yield rate. In addition, the pattern of the topmost layer in the circuit structures of the multilayer structures is engaged with the pattern of the top surface of the conductive structure of the interconnect substrate, so that the interconnect substrate and the multilayer structures are bonded together, thereby enhancing the reliability.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A to FIG. 2D are schematic cross-sectional diagrams of a manufacturing process of a multilayer structure according to the first embodiment of the invention.

FIG. 4A to FIG. 4D are schematic cross-sectional diagrams of a manufacturing process of a multilayer structure according to the second embodiment of the invention.

FIG. 6A to FIG. 6G are schematic cross-sectional diagrams of a manufacturing process of an interconnect substrate according to a third embodiment of the invention.

DESCRIPTION OF THE EMBODIMENTS

Figure 1A:
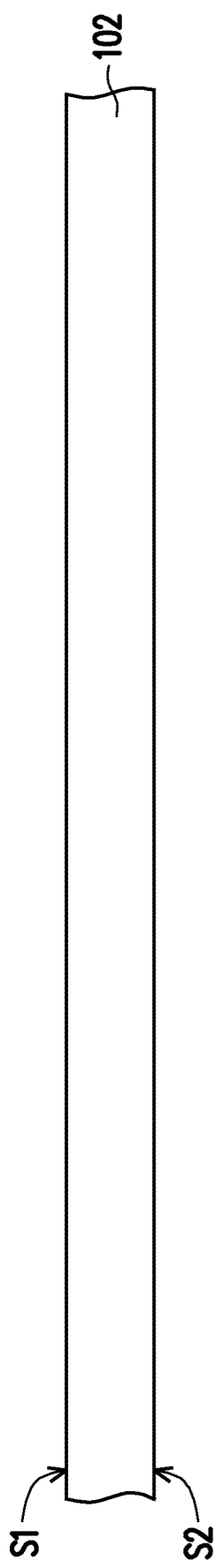
FIG. 1A to FIG. 1E are schematic cross-sectional diagrams of a manufacturing process of an interconnect substrate according to a first embodiment of the invention.

The invention is more comprehensively described with reference to the figures of the present embodiments. However, the invention can also be implemented in various different forms, and is not limited to the embodiments in the present specification. The thicknesses of the layers and regions in the figures are enlarged for clarity. The same or similar reference numerals represent the same or similar devices and are not repeated in the following paragraphs.

FIG. 1A to FIG. 1E are schematic cross-sectional diagrams of a manufacturing process of an interconnect substrate according to a first embodiment of the invention.

With reference to FIG. 1A, a core layer 102 is provided, and the core layer 102 has a first surface S1 and a second surface S2 opposite to each other (i.e., two opposite surfaces). In this embodiment, the core layer 102 may be made of prepreg (pp) or other suitable dielectric materials. Nevertheless, in invention is not limited thereto. In other embodiments, the core layer 102 may also be an insulation substrate, a glass substrate, or a combination thereof.

Figure 1B:
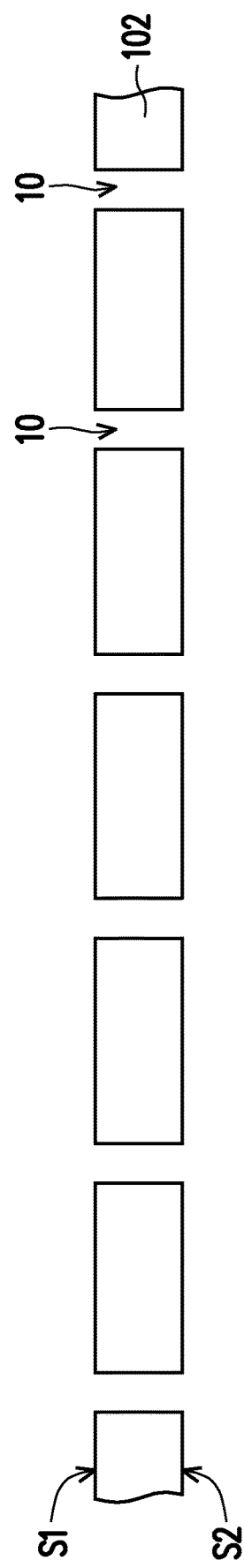

With reference to FIG. 1B, a plurality of through holes 10 are formed in the core layer 102, so as to communicate with the first surface S1 and the second surface S2 of the core layer 102. That is, the through holes 10 penetrate through the core layer 102 to extend from the first surface S1 of the core layer 102 to the second surface S2 of the core layer 102. In an embodiment, the through holes 10 may be formed through mechanical drilling or laser drilling or through other suitable methods.

Figure 1C:
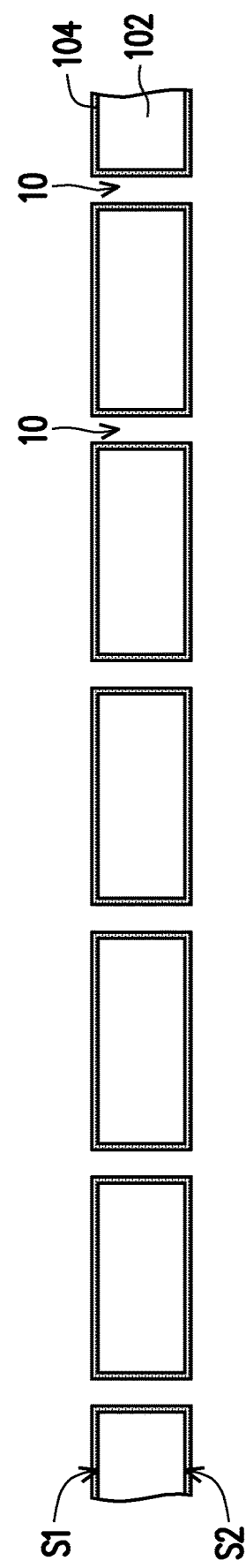

With reference to FIG. 1C, a seed layer 104 is formed on the core layer 102. The seed layer 104 covers the first surface S1 and the second surface S2 of the core layer 102 and surfaces of the through holes 10. In an embodiment, a material of the seed layer 104 includes metal, such as copper or titanium/copper. The seed layer 104 may be formed through chemical plating, sputtering coating, or a combination thereof.

Figure 1D:
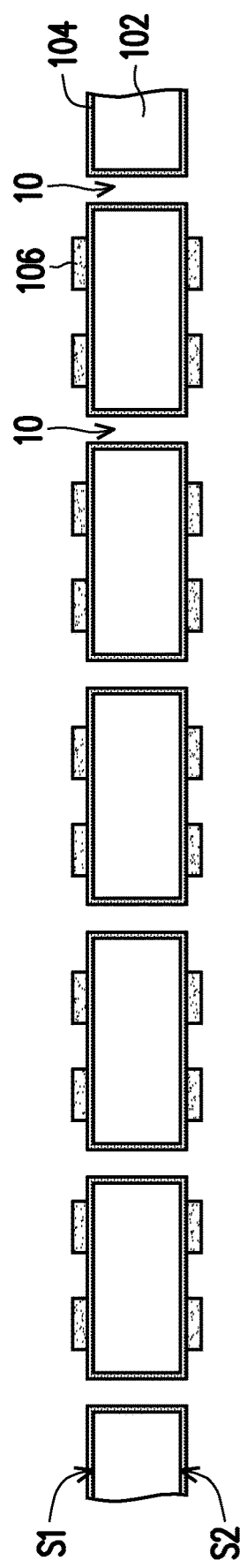

With reference to FIG. 1D, photoresist patterns 106 are formed on the first surface S1 and the second surface S2 of the core layer 102. The photoresist patterns 106 cover one portion of a surface of the seed layer 104 to expose the other portion of the surface of the seed layer 104. In an embodiment, the photoresist patterns 106 may be configured to define positions of conductive structures 110a (as shown in FIG. 1E) to be subsequently formed.

Figure 1E:
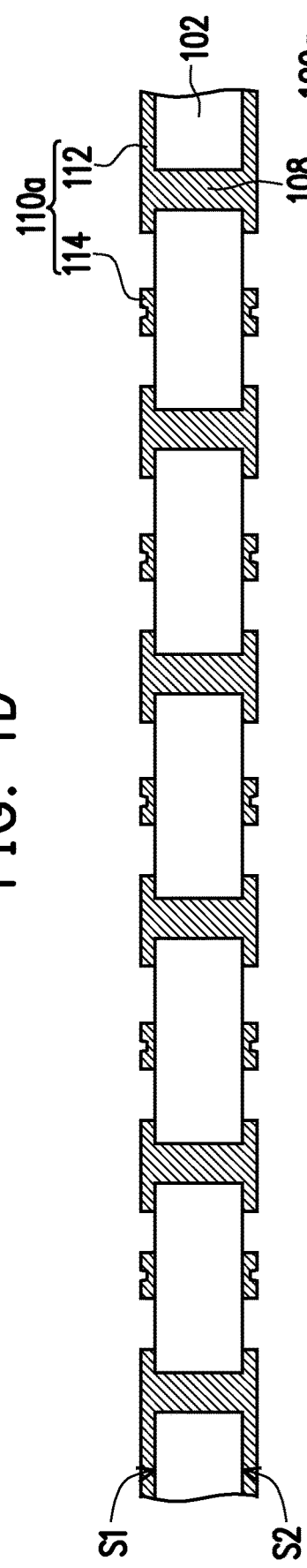

With reference to FIG. 1D and FIG. 1E, a plating process is performed, so as to form the conductive structures 110a respectively on the first surface S1 and the second surface S2 of the core layer 102 and form a plurality of through vias 108 in the through holes 10. The conductive structures 110a may be electrically connected to or be in contact with the through vias 108. In this way, the conductive structure 110a on the first surface S1 may be electrically connected to the conductive structure 110a on the second surface S2 by the through vias 108. In an embodiment, materials of the conductive structures 110a and the through vias 108 include metal, such as copper or other similar materials.

Figure 3A:
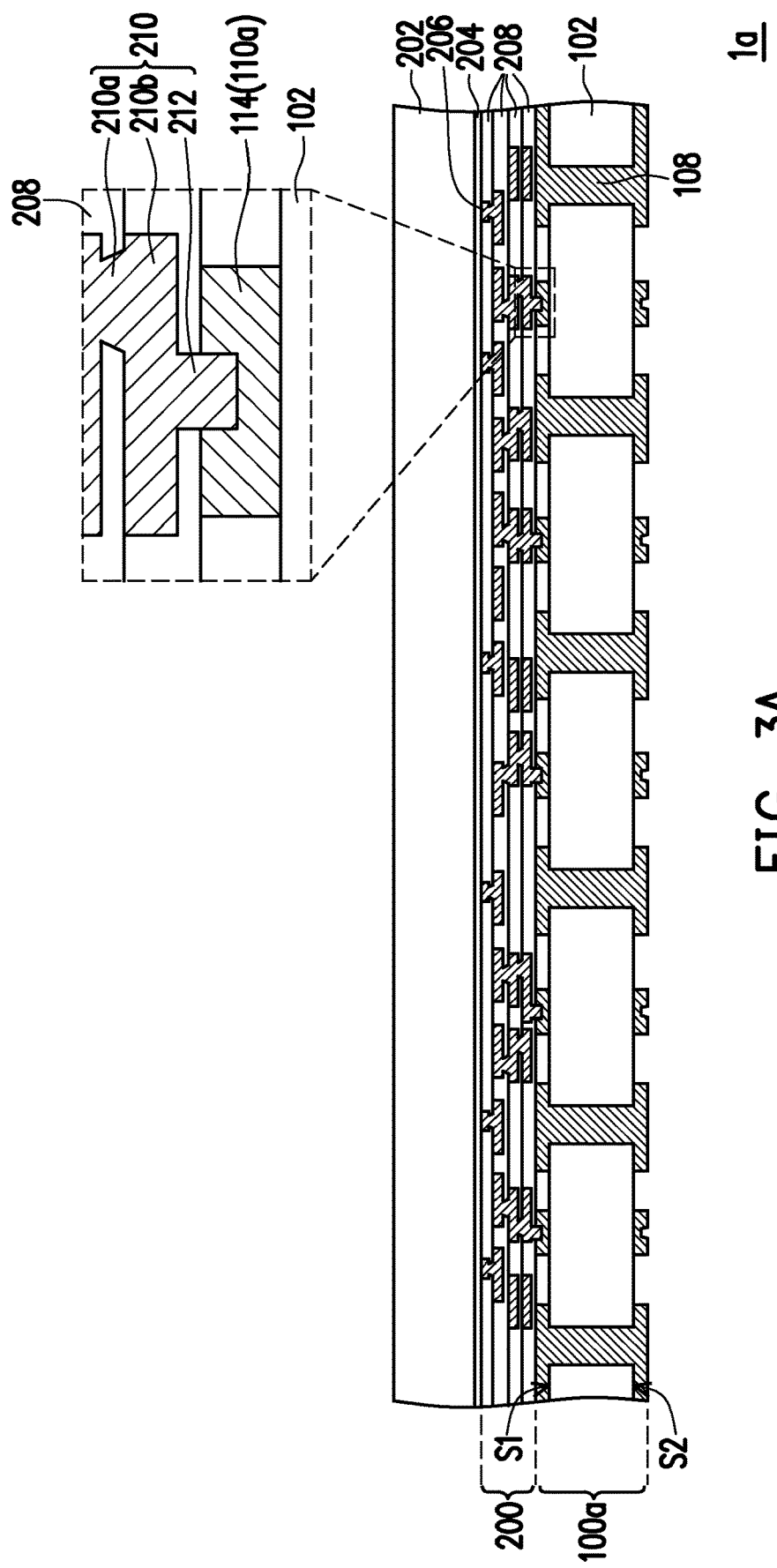
FIG. 3A is a schematic cross-sectional diagram of a circuit board according to the first embodiment of the invention.

Specifically, each of the conductive structures 110a includes a first portion 112 and a second portion 114. As shown in FIG. 1E, the first portion 112 may include a substantially flat top surface, and the second portion 114 has a concave top surface. In this embodiment, the second portion 114 of the conductive structure 110a may be configured to be bonded to a circuit structure 210 (as shown in FIG. 3A) in the subsequent process. Nevertheless, the invention is not limited thereto. In other embodiments, the first portion 112 may include a concave top surface, and the second portion 114 has a substantially flat top surface. In other alternative embodiments, the first portion 112 and the second portion 114 both have concave top surfaces.

After the conductive structures 110a and the through vias 108 are formed, the photoresist patterns 106 and the portion of the seed layer 104 covered by the photoresist patterns 106 may be removed. That is, the first portions 112 and the second portions 114 may be, for example, electrically insulated. The remaining seed layer 104 is not depicted in FIG. 1E, but the remaining seed layer 104 is provided between the conductive structures 110a and the core layer 102 and between the through vias 108 and the core layer 102. As shown in FIG. 1E, after the photoresist patterns 106 are removed, an interconnect substrate 100a of the first embodiment is accomplished.

Figure 1F:
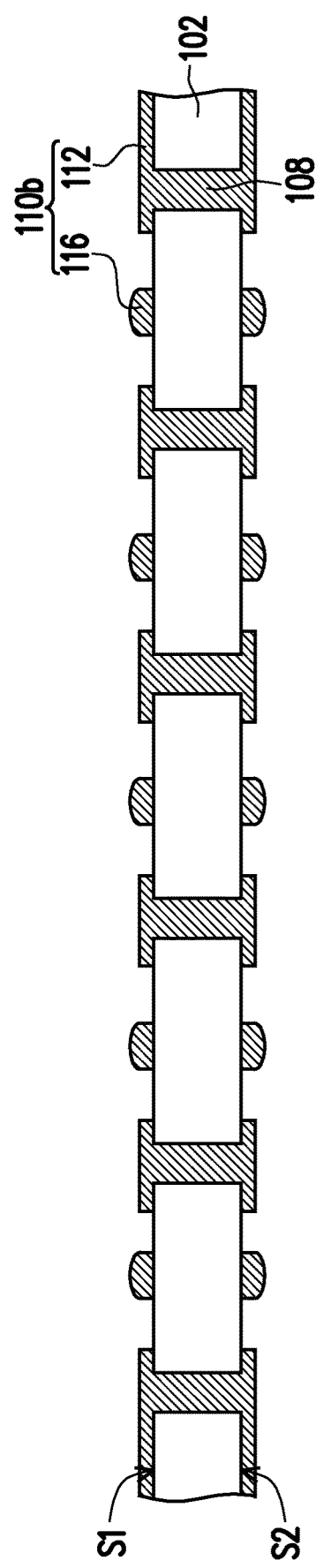
FIG. 1F is a schematic cross-sectional diagram of an interconnect substrate according to a second embodiment of the invention.

FIG. 1F is a schematic cross-sectional diagram of an interconnect substrate according to a second embodiment of the invention. Note that FIG. 1F depicts a structure which is subsequently formed after the structure of FIG. 1D is formed.

With reference to FIG. 1D and FIG. 1F, a plating process is performed, so as to form conductive structures 110b respectively on the first surface S1 and the second surface S2 of the core layer 102 and form a plurality of through vias 108 in the through holes 10. Specifically, each of the conductive structures 110b includes a first portion 112 and a second portion 116. As shown in FIG. 1F, the first portion 112 may include a substantially flat top surface, and the second portion 116 has a convex top surface. In this embodiment, the second portion 116 of the conductive structure 110b may be configured to be bonded to the circuit structure 210 (as shown in FIG. 3A). Nevertheless, the invention is not limited thereto. In other embodiments, the first portion 112 may include a convex top surface, and the second portion 116 has a substantially flat top surface. As shown in FIG. 1F, after the photoresist patterns 106 are removed, an interconnect substrate 100b of the second embodiment is accomplished.

FIG. 2A to FIG. 2D are schematic cross-sectional diagrams of a manufacturing process of a multilayer structure according to the first embodiment of the invention.

With reference to FIG. 2A, a carrier 202 is provided. In an embodiment, the carrier 202 may be a glass substrate, a S1 substrate, a ceramic substrate, or a combination thereof.

Next, a release layer 204 is formed on the carrier 202. In an embodiment, the release layer 204 may be a photo-curable release film or a thermal curable release film. Viscosity of the photo-curable release film is decreased through a photo-curing process, and viscosity of the thermal curable release film is decreased through a thermal-curing process. In this embodiment, the release layer 204 may be a laser debond release film.

With reference to FIG. 2B, a plurality of conductive layers 206 are formed on the release layer 204. In an embodiment, a material of the conductive layers 206 includes metal, such as copper or other similar materials. The conductive layers 206 may be formed by forming a photoresist layer (not shown) first, and a plurality of openings are formed in the photoresist layer to expose the release layer 204. A plating process is then performed to form the conductive layers 206 in the openings. Afterwards, the photoresist layer is removed.

Figure 2C:
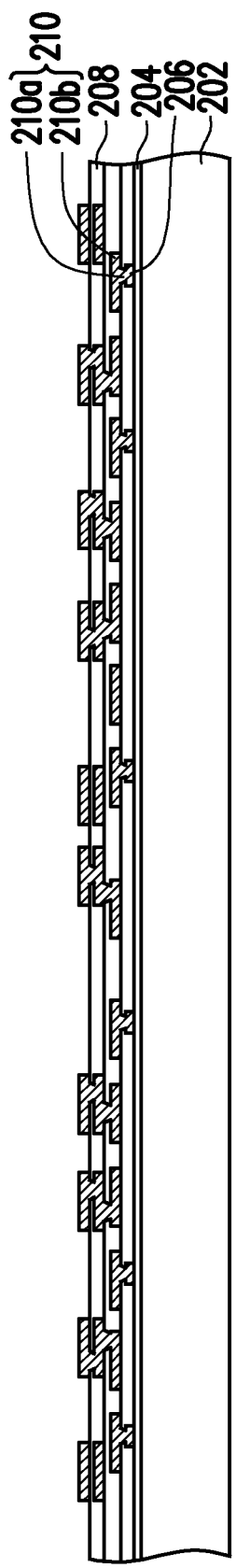

With reference to FIG. 2B and FIG. 2C, a circuit structure 210 is formed on the conductive layers 206. To be specific, a dielectric material (not shown) is formed on the release layer 204 first. The dielectric material covers the conductive layers 206 and fills gaps among the conductive layers 206. In an embodiment, the dielectric material includes prepreg (pp), an ajinomoto build-up film (ABF), polyimide (PI), epoxy, or a combination thereof.

Next, a plurality of openings (not shown) are formed in the dielectric material to expose portions of surfaces of the conductive layers 206. Next, a plating process is performed to form the circuit structure 210. The obtained structures include the circuit structure 210 disposed in a dielectric layer 208, as shown in FIG. 2C. To be specific, the circuit structure 210 may include a plurality of through vias 210a and a plurality of circuit layers 210b. The through vias 210a are disposed in the openings. The circuit layers 210b are disposed on the through vias 210a. The through vias 210a are disposed between the circuit layers 210b and the conductive layers 206, so that the circuit layers 210b are electrically connected to the conductive layers 206.

Figure 2D:
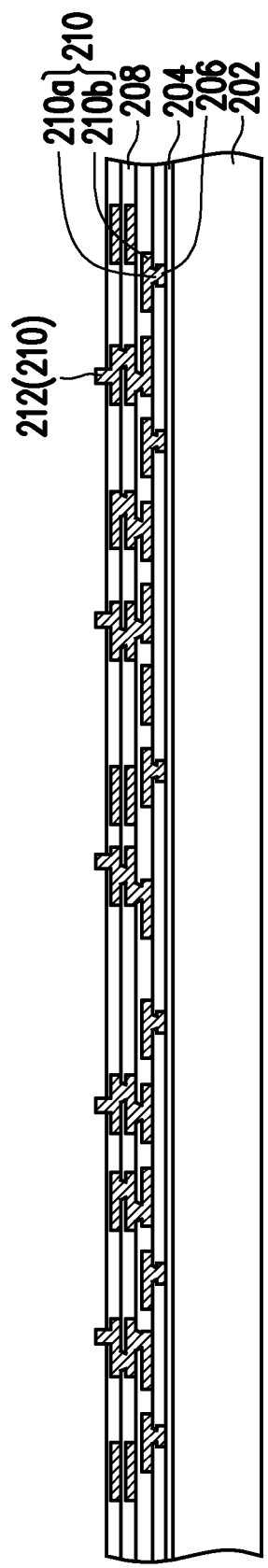

At present, the single-layered circuit structure 210 are formed, but the invention is not limited thereto. To be specific, the number of layers of the circuit structure 210 may be increased through a build-up manner in this embodiment, and the number of layers may be adjusted according to design needs. As shown in FIG. 2D, after the number of layers of the circuit structure 210 is increased, a topmost layer 212 in the circuit structures 210 is exposed to the dielectric layer 208. After the topmost layer 212 of the circuit structures 210 is formed, a multilayer structure 200 of the first embodiment is accomplished, as shown in FIG. 2D. Since the carrier 202 and the release layer 204 are removed in the following process, the multilayer structure 200 herein refers to the dielectric layer 208 and the circuit structures 210 in the dielectric layer 208.

In addition, in an embodiment, as shown in FIG. 2D, the topmost layer 212 of the circuit structures 210 may be bump structures, but the invention is not limited thereto. In other embodiments, the topmost layer 212 in the circuit structures 210 may also be under bump metal (UBM) layers.

FIG. 3A is a schematic cross-sectional diagram of a circuit board according to the first embodiment of the invention.

With reference to FIG. 3A, a bonding step is performed, so as to bond the multilayer structure 200 of FIG. 2D and the interconnect substrate 100a of FIG. 1E together to form a single-sided circuit board 1a. To be specific, a pattern of the topmost layer 212 in the circuit structures 210 and a pattern of the top surface of the second portion 114 of the conductive structure 110a are engaged with each other. In an embodiment, as shown by the enlarged diagram of FIG. 3A, the pattern of the topmost layer 212 in the circuit structures 210 is a convex pattern, and the pattern of the top surface of the second portion 114 of the conductive structure 110a is a concave pattern. The convex pattern and the concave pattern correspond to each other to be meshed together. Nevertheless, the invention is not limited thereto. In other embodiments, the pattern in the topmost layer 212 of the circuit structures 210 may be a concave pattern, and the pattern of the top surface of the second portion 114 of the conductive structure 110a may be a convex pattern. The concave pattern and the convex pattern correspond to each other.

A certain degree of temperature and a certain level of pressure are required in the bonding step, so that the topmost layer 212 in the circuit structures 210 of the multilayer structure 200 and the top surface of the second portion 114 of the conductive structure 110a of the interconnect substrate 100a may be bonded together. In an embodiment, the temperature and pressure in the bonding step may be adjusted according to the materials or manufacturing needs. In an embodiment, a material of the circuit structures 210 of the multilayer structure 200 is identical to the material of the conductive structure 110a. For instance, the material of the circuit structures 210 of the multilayer structure 200 and the material of the conductive structure 110a are both copper metal. Hence, the multilayer structure 200 and the interconnect substrate 100a may be bonded together through copper-to-copper bonding in this embodiment, so that the circuit board 1a is formed.

Besides, in FIG. 3A, although the topmost layer 212 in the circuit structures 210 is partially embedded in the top surface of the second portion 114 of the conductive structure 110a, the invention is not limited thereto. In other embodiments, the topmost layer 212 in the circuit structures 210 may be entirely embedded in the top surface of the second portion 114 of the conductive structure 110a. That is, the circuit layer 210b in the circuit structure 210 may be in direct contact with the top surface of the second portion 114 of the conductive structure 110a, so that no dielectric layer is provided between the circuit layer 210b in the circuit structure 210 and the second portion 114 of the conductive structure 110a.

In addition, after the topmost layer 212 in the circuit structures 210 of the multilayer structure 200 and the top surface of the second portion 114 of the conductive structure 110a of the interconnect substrate 100a are bonded together, the carrier 202 and the release layer 204 are removed to expose the conductive layers 206. In an embodiment, the removing step may include irradiation, heating, or laser dissociation to decrease viscosity of the release layer 204, so that the carrier 202 is separated from the multilayer structure 200.

Figure 3B:
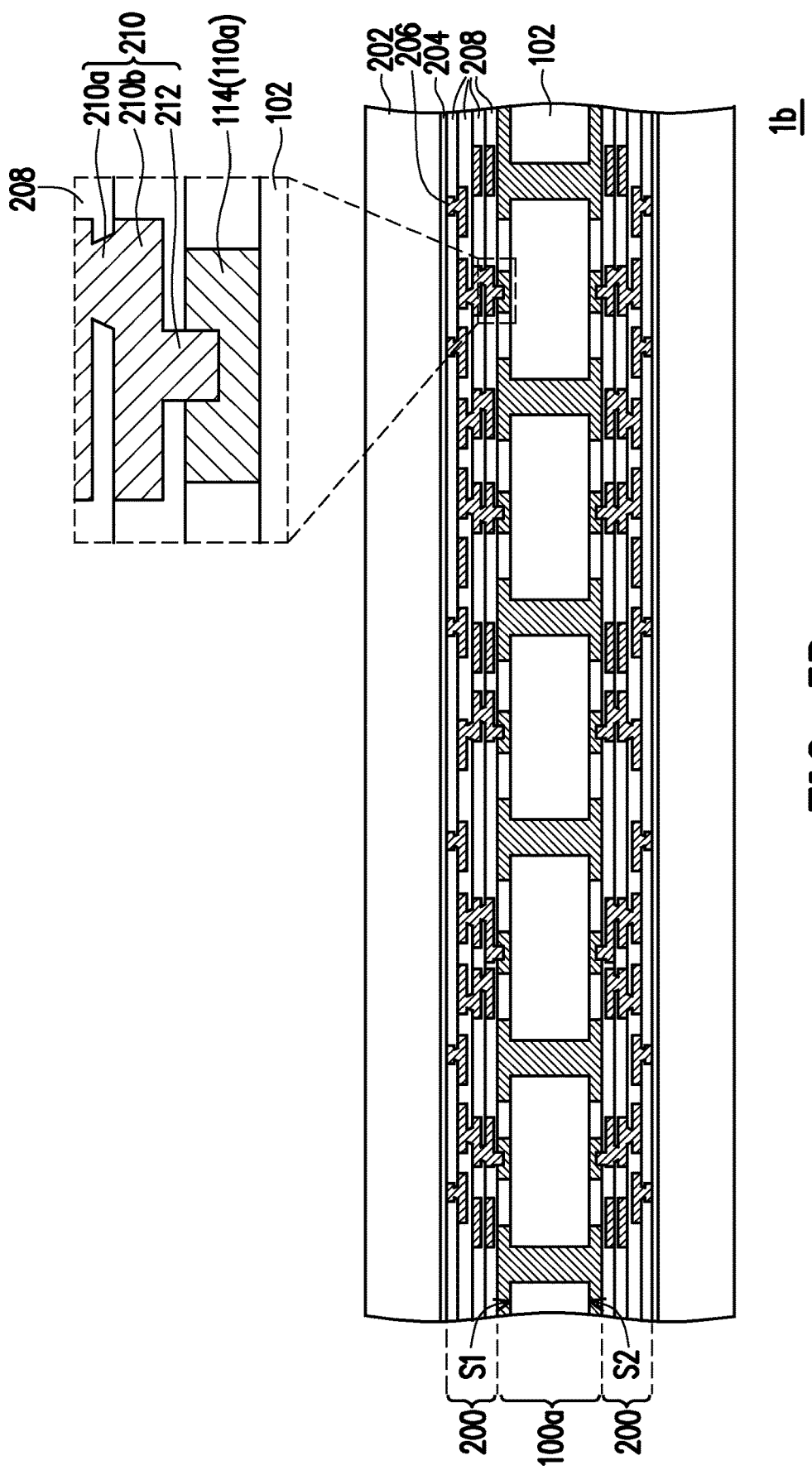
FIG. 3B is a schematic cross-sectional diagram of a circuit board according to the second embodiment of the invention.

FIG. 3B is a schematic cross-sectional diagram of a circuit board according to the second embodiment of the invention.

Basically, a structure of a circuit board 1b of FIG. 3B is similar to the structure of the circuit board 1a of FIG. 3A. The difference therebetween is that the circuit board 1b of FIG. 3B has a double-sided circuit board structure. That is, the multilayer structure 200 of FIG. 2D may include two multilayer structures 200 that are respectively disposed at two opposite sides of the interconnect substrate 100a of FIG. 1E (or disposed on the first surface S1 and the second surface S2 of the core layer 102). In the circuit board 1b of this embodiment, the multilayer structures 200 are bonded to the interconnect substrate 100a through copper-to-copper bonding as well. The bonding step is described in detail in the foregoing paragraphs, and thus related description is not provided therein.

Further, the interconnect substrates depicted in FIG. 3A and FIG. 3B both are the interconnect substrate 100a of FIG. 1E, but the invention is not limited thereto. In other embodiments, the interconnect substrate 100b of FIG. 1F may also be bonded to the multilayer structures through copper-to-copper bonding.

FIG. 4A to FIG. 4D are schematic cross-sectional diagrams of a manufacturing process of a multilayer structure according to the second embodiment of the invention.

With reference to FIG. 4A, an embedded chip molding (ECM) substrate 301 is provided. In an embodiment, the embedded chip molding substrate 301 includes a molding material 302 and a plurality of chips 304. The chips 304 are disposed in the molding material 302. The chips 304 are laterally encapsulated by the molding material 302, and active surfaces 304a of the chips are exposed. In an embodiment, each of the chips 304 further includes a pad 305, a conductive layer 306, and a passivation layer 307. The pad 305 is distributed on the active surface 304a, and a portion of the pad 305 is exposed by the passivation layer 307. Although each of the chips 304 depicted in FIG. 4A has only one pad 305, the invention is not limited thereto. In other embodiments, each of the chips 304 may have a plurality of pads 305 distributed therein. The passivation layer 307 covers the active surface 304a of each of the chips 304 and partially covers the pad 305. The conductive layer 306 is formed on the pad 305 of each of the chips 304 and extends to a surface of the passivation layer 307. In an embodiment, the molding material 302 may be polyimide (PI), epoxy, silicon dioxide (filler), or a combination thereof. In an embodiment, the chips 304 may have a same function or different functions.

With reference to FIG. 4B to FIG. 4D, a multilayer structure 300 is formed on the embedded chip molding substrate 301. To be specific, a dielectric material 308 is formed on the embedded chip molding substrate 301 first. The dielectric material 308 covers the conductive layers 306 and fills gaps among the conductive layers 306. In an embodiment, the dielectric material includes prepreg (pp), an ajinomoto build-up film (ABF), polyimide (PI), epoxy, or a combination thereof.

Next, as shown in FIG. 4B, a plurality of openings 12 are formed in the dielectric material 308 to expose portions of surfaces of the conductive layers 306. Next, a plating process is performed to form a circuit structure 310. As shown in FIG. 4C, the circuit structure 310 is disposed in the dielectric layer 308 and extend to cover a top surface of the dielectric layer 308.

The circuit structure 310 may include a plurality of through vias 310a and a plurality of circuit layers 310b. The through vias 310a are disposed in the openings 12. The circuit layers 310b are disposed on the through vias 310a. The through vias 310a are disposed between the circuit layers 310b and the conductive layers 306, so that the circuit layers 310b are electrically connected to the conductive layers 306 (or the pads 305 of the chips 304).

At present, the single-layered circuit structure 310 is formed, but the invention is not limited thereto. To be specific, the number of layers of the circuit structure 310 may be increased through the build-up manner in this embodiment. As shown in FIG. 4D, after the number of layers of the circuit structure 310 is increased, a topmost layer 312 in the circuit structures 310 is exposed to the dielectric layer 308. After the topmost layer 312 of in the circuit structures 310 are formed, the multilayer structure 300 of the second embodiment is accomplished, as shown in FIG. 4D.

Figure 5:
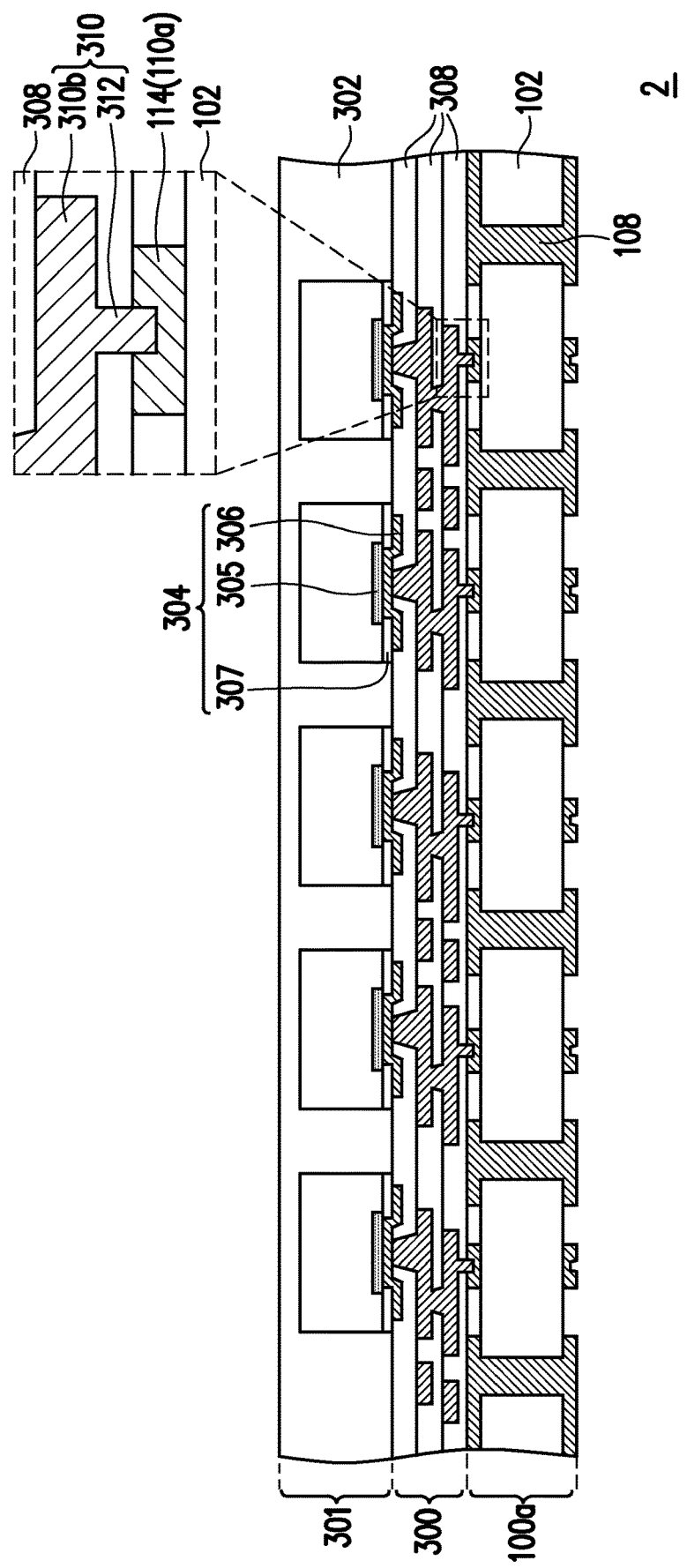
FIG. 5 is a schematic cross-sectional diagram of a package structure according to the first embodiment of the invention.

FIG. 5 is a schematic cross-sectional diagram of a package structure according to the first embodiment of the invention.

With reference to FIG. 5, a bonding step is performed, so as to bond the multilayer structure 300 of FIG. 4D and the interconnect substrate 100a of FIG. 1E together to form a single-sided package structure 2. To be specific, a pattern of the topmost layer 312 in the circuit structures 310 and a pattern of the top surface of the second portion 114 of the conductive structure 110a are engaged with each other. In an embodiment, as shown by the enlarged diagram of FIG. 5, the pattern of the topmost layer 312 in the circuit structures 310 is a convex pattern, and the pattern of the top surface of the second portion 114 of the conductive structure 110a is a concave pattern. The convex pattern and the concave pattern correspond to each other to be meshed together. Nevertheless, the invention is not limited thereto. In other embodiments, the pattern of the topmost layer 312 in the circuit structures 310 may be a concave pattern, and the pattern of the top surface of the second portion 114 of the conductive structure 110a may be a convex pattern.

The concave pattern and the convex pattern correspond to each other. The bonding step is described in detail in the foregoing paragraphs, and thus related description is not provided therein.

Further, the package structure 2 depicted in FIG. 5 is a single-sided package structure, but the invention is not limited thereto. In other embodiments, the package structure 2 may be a double-sided package structure. That is, the multilayer structure 300 of FIG. 4D may include two multilayer structures 300 that are disposed at the two opposite sides of the interconnect substrate 100a of FIG. 1E.

FIG. 6A to FIG. 6G are schematic cross-sectional diagrams of a manufacturing process of an interconnect substrate according to a third embodiment of the invention.

With reference to FIG. 6A, a core layer 402 is provided, and the core layer 402 has a first surface S1 and a second surface S2 opposite to each other (i.e., two opposite surfaces). In this embodiment, the core layer 402 may be a copper clad laminate (CCL) that has two copper foils 403 disposed on the first surface S1 and the second surface S2 of the core layer 402.

With reference to FIG. 6B, a plurality of through holes 14 are formed in the core layer 402, so as to communicate with the first surface S1 and the second surface S2 of the core layer 402. That is, the through holes 14 penetrate through the core layer 402 and the two copper foils 403 to extend from the first surface S1 of the core layer 402 to the second surface S2 of the core layer 402. In an embodiment, the through holes 14 may be formed through mechanical drilling or laser drilling or through other suitable methods.

Figure 6D:
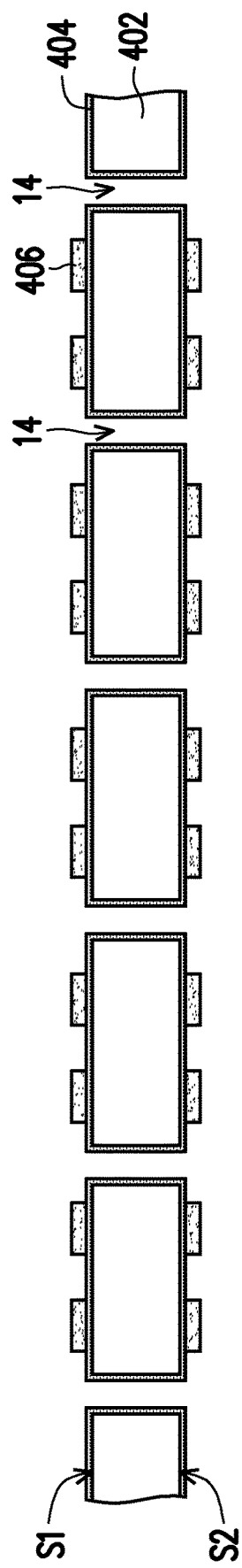

With reference to FIG. 6C, a seed layer 404 is formed on the core layer 402. The seed layer 404 covers the first surface S1 and the second surface S2 of the core layer 402 and surfaces of the through holes 14. Since a material and a forming method of the seed layer 404 are similar to the material and the forming method of the seed layer 104, related description is thus omitted. Incidentally, the copper foils 403 are included in the seed layer 404 depicted in FIG. 6C, and thus, the copper foils 403 are not depicted in FIG. 6C to FIG. 6E.

With reference to FIG. 6D, photoresist patterns 406 are respectively formed on the first surface S1 and the second surface S2 of the core layer 402. The photoresist patterns 406 cover one portion of a surface of the seed layer 404 to expose the other portion of the surface of the seed layer 404. In an embodiment, the photoresist patterns 406 may be configured to define positions of conductive structures 410 (as shown in FIG. 6E) to be subsequently formed.

Figure 6E:
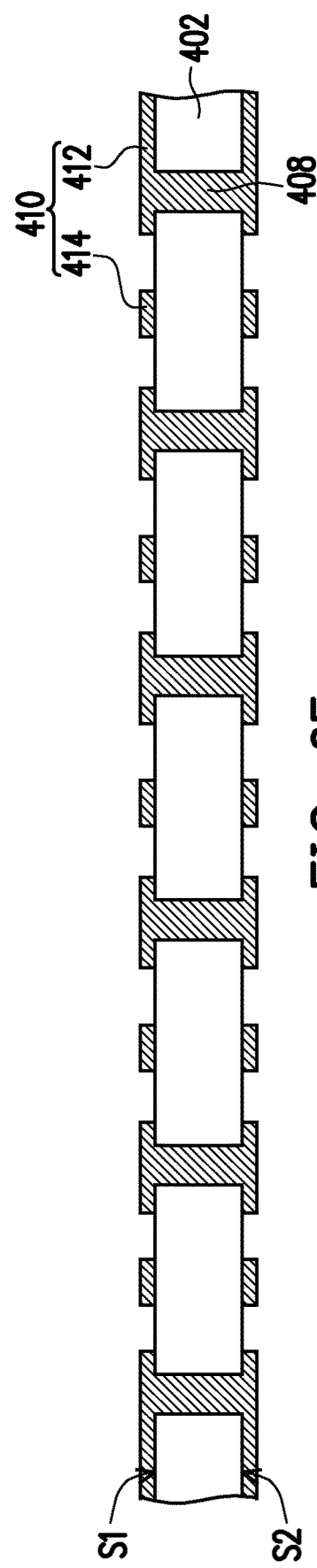

With reference to FIG. 6D and FIG. 6E, a plating process is performed, so as to form the conductive structures 410 respectively on the first surface S1 and the second surface S2 of the core layer 402 and form a plurality of through vias 408 in the through holes 14. The conductive structures 410 may be electrically connected to or be in contact with the through vias 408. In this way, the conductive structure 410 on the first surface S1 may be electrically connected to the conductive structure 410 on the second surface S2 by the through vias 408. In an embodiment, materials of the conductive structures 410 and the through vias 408 include metal, such as copper or other similar materials.

Specifically, each of the conductive structures 410 includes a first portion 412 and a second portion 414. As shown in FIG. 6E, the first portions 412 are connected to the through vias 408, and the second portions 414 are separated from the first portions 412.

After the conductive structures 410 and the through vias 408 are formed, the photoresist patterns 406 and the portion of the seed layer 404 covered by the photoresist patterns 406 may be removed. The remaining seed layer 404 is not depicted in FIG. 6E, but the remaining seed layer 104 is provided between the conductive structures 410 and the core layer 402 and between the through vias 408 and the core layer 402.

With reference to FIG. 6F, photopatternable dielectric materials 416 are respectively formed on the first surface S1 and the second surface S2 of the core layer 402. Next, a photolithography process is performed to form a plurality of openings 16 in the photopatternable dielectric materials 416. The openings 16 expose portions of surfaces of the second portions 414 of the conductive structures 410.

With reference to FIG. 6G, a plurality of conductive layers 418 are formed in the openings 16 to form an interconnect substrate 400. The conductive layers 418 are electrically connected to the second portions 414 of the conductive structures 410. In this embodiment, a pattern of top surfaces of the conductive layers 418 is a concave pattern that may be configured to be bonded to the convex pattern of the topmost layer of the circuit structures 210 in FIG. 3A. In an embodiment, the material of the circuit structures 210 of the multilayer structure 200 is identical to a material of the conductive layers 418. For instance, the circuit structures 210 of the multilayer structure 200 and the conductive layers 418 are both made of copper metal. Hence, the interconnect substrate 400 and the multilayer structure 200 may be bonded together through copper-to-copper bonding in this embodiment, so that another circuit board is formed.

In an alternative embodiment, the interconnect substrate 400 of FIG. 6G may also be bonded to the multilayer structure 300 of FIG. 4D, so that another package structure is formed.

In view thereof, in the embodiments of the invention, the multilayer structures are formed on the two surfaces of the interconnect substrate, so as to decrease the number of layers of the multilayer structures, thereby improving the warpage issue and increasing the yield rate. In addition, the pattern of the topmost layer in the circuit structures of the multilayer structures is engaged with the patterns of the top surfaces of the conductive structures of the interconnect substrate, so that the interconnect substrate and the multilayer structures are bonded together, thereby enhancing the reliability.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A circuit board, comprising: an interconnect substrate, including a core layer and a conductive structure disposed on the core layer; and a multilayer structure, disposed on the conductive structure, wherein the multilayer structure comprises: a plurality of dielectric layers; and a plurality of circuit structures, disposed in the dielectric layers, a topmost layer in the circuit structures exposed to the dielectric layers, so as to contact with the conductive structure, wherein a pattern of the topmost layer in the circuit structures and a pattern of a top surface of the conductive structure are engaged with each other, wherein the pattern of the topmost layer in the circuit structures are convex patterns when the pattern of the top surface of the conductive structure is a concave pattern, and the pattern of the topmost layer in the circuit structures is a concave pattern when the pattern of the top surface of the conductive structure is a convex pattern.

2. The circuit board as claimed in claim 1, wherein a material of the circuit structures and a material of the conductive structure are identical.

3. The circuit board as claimed in claim 1, wherein a material of the circuit structures comprises copper, and a material of the conductive structure comprises copper.

4. The circuit board as claimed in claim 1, wherein the core layer comprises an insulation substrate, a glass substrate, a copper foil substrate, or a combination thereof.

5. The circuit board as claimed in claim 1, wherein the interconnect substrate comprises a plurality of through vias disposed in the core layer to be electrically connected to the conductive structure.

6. The circuit board as claimed in claim 5, wherein the conductive structure comprises two conductive structures, and the two conductive structures are disposed on two opposite surfaces of the core layer, and the multilayer structure comprises two multilayer structures, and the two multilayer structures are disposed on the two conductive structures and are in contact with the two conductive structures.

7. A package structure, comprising:
the circuit board as claimed in claim 1; and
an embedded chip molding substrate, disposed on the multilayer structure of the circuit board, so that the multilayer structure is disposed between the interconnect substrate and the embedded chip molding substrate.

8. The package structure as claimed in claim 7, wherein the embedded chip molding substrate comprises a plurality of chips disposed in a molding material, and the chips are electrically connected to the multilayer structure.

* * * * *